US009523727B2

(12) United States Patent
Han et al.

(10) Patent No.: US 9,523,727 B2
(45) Date of Patent: Dec. 20, 2016

(54) ELECTRONIC DEVICE WITH IMPEDANCE MEASUREMENT CIRCUITRY

(71) Applicant: Apple Inc., Cupertino, CA (US)

(72) Inventors: Liang Han, Cupertino, CA (US); Matthew A. Mow, Los Altos, CA (US); Thomas E. Biedka, San Jose, CA (US); Ming-Ju Tsai, Cupertino, CA (US); James G. Judkins, Campbell, CA (US); Victor C. Lee, Sunnyvale, CA (US); Mattia Pascolini, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/980,591

(22) Filed: Dec. 28, 2015

(65) Prior Publication Data

US 2016/0204821 A1    Jul. 14, 2016

Related U.S. Application Data

(60) Provisional application No. 62/102,954, filed on Jan. 13, 2015.

(51) Int. Cl.
| | |
|---|---|
| *H04B 1/40* | (2015.01) |
| *G01R 29/10* | (2006.01) |
| *H04B 1/04* | (2006.01) |
| *H04B 1/18* | (2006.01) |

(52) U.S. Cl.
CPC .............. *G01R 29/10* (2013.01); *H04B 1/0458* (2013.01); *H04B 1/18* (2013.01); *H04B 1/40* (2013.01)

(58) Field of Classification Search
CPC ........... H04B 1/40; H04B 1/48; H04B 1/0458; H04B 17/00; H04B 17/0042; H04B 17/23; H04B 17/29; H04B 17/345; H04B 1/18; H03H 7/38; H03G 3/3042; G01R 23/20; G01R 31/00; G01R 29/10

See application file for complete search history.

(56) References Cited

U.S. PATENT DOCUMENTS

| | | | |
|---|---|---|---|
| 7,512,413 B2 | 3/2009 | Hui et al. | |
| 7,821,273 B2 * | 10/2010 | Van Bezooijen | .... H04B 1/0458 324/646 |
| 8,781,420 B2 | 7/2014 | Schlub et al. | |
| 8,963,611 B2 | 2/2015 | See et al. | |

(Continued)

*Primary Examiner* — Thanh Le
(74) *Attorney, Agent, or Firm* — Treyz Law Group, P.C.; G. Victor Treyz; Andrew C Milhollin

(57) ABSTRACT

An electronic device may be provided with wireless circuitry. The wireless circuitry may include wireless transceiver circuitry that transmits signals towards an antenna. A signal path may carry the transmitted signals to the antenna. Reflected signals from the antenna may be carried along the signal path towards the transceiver circuitry. Coupler circuitry may include a forward coupler that taps the transmitted signals, a first reverse coupler that taps the reflected signals from the antenna, and a second reverse coupler that taps the reflected signals that have passed through the first reverse coupler. Analog processing circuitry and digital processing circuitry may be used to produce an impedance measurement from the tapped signals from the coupler circuitry. The analog processing circuitry may include analog signal mixers, low pass filters, and analog-to-digital converter circuitry.

21 Claims, 5 Drawing Sheets

(56) References Cited

U.S. PATENT DOCUMENTS

| | | | |
|---|---|---|---|
| 2005/0159119 A1* | 7/2005 | Kataoka | H03G 3/3042 455/127.2 |
| 2014/0146866 A1* | 5/2014 | Strachan | H04B 17/309 375/226 |
| 2015/0065065 A1 | 3/2015 | Rofougaran et al. | |
| 2015/0372656 A1 | 12/2015 | Mow et al. | |
| 2016/0097833 A1* | 4/2016 | Han | H04B 17/14 343/702 |

* cited by examiner $$S_i(t) = \alpha(t)\cos[\omega_c t + \theta(t)]$$

$$S_{r1}(t) = |\Gamma|\alpha(t)\cos[\omega_c t + \theta(t) - \varphi]$$

$$S_{r2}(t) = \rho|\Gamma|\alpha(t)\cos[\omega_c t + \theta(t) - \varphi + \Phi] \quad \alpha = \rho e^{j\Phi}$$

$$\Gamma = |\Gamma|e^{j\varphi} = |\Gamma|\cos(\varphi) + j|\Gamma|\sin(\varphi)$$

Definitions:

1) $S_i(t)$: sampled incident signal from forward coupler;

2) $S_{r1}(t)$: sampled reflected signal from reverse coupler 1;

3) $S_{r2}(t)$: sampled incident signal from reverse coupler 2;

4) $\Gamma$: unknown reflection coefficient of the AUT;

5) $\alpha$: known offset between two samples of the reflected signal;

FIG. 4

ELECTRONIC DEVICE WITH IMPEDANCE MEASUREMENT CIRCUITRY

This application claims the benefit of provisional patent application No. 62/102,954 filed on Jan. 13, 2015, which is hereby incorporated by reference herein in its entirety.

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

In some wireless devices, wireless performance can be influenced by environmental factors such as the presence of nearby objects that load antennas within the devices. To ensure that a device is performing satisfactorily, it may be desirable to measure antenna impedance during operation. The antenna impedance information may then be used in adjusting the antenna. If care is not taken, however, impedance measurement circuitry may consume more device resources than desired or may be insufficiently accurate to use when controlling the operation of wireless circuitry in a device.

It would therefore be desirable to be able to provide improved wireless circuitry for electronic devices such as improved impedance monitoring circuitry for wireless electronic devices.

SUMMARY

An electronic device may be provided with wireless circuitry. The wireless circuitry may include wireless transceiver circuitry that transmits signals to an antenna. Impedance measurement circuitry may be interposed between the transceiver and the antenna, may be incorporated into an integrated circuit associated with an antenna tuning component or other tunable antenna circuitry, may be formed as part of an antenna, or may be located elsewhere within the wireless circuitry for measuring impedances.

A signal path may carry transmitted signals from the transceiver circuitry to the antenna. Reflected signals from the antenna may be carried along the signal path towards the transceiver circuitry. In a configuration in which the impedance measurement circuitry is located between the transceiver and the antenna, the impedance measurement circuitry may have coupler circuitry that is located along the signal path. The coupler circuitry may include a forward coupler portion that taps the transmitted signals, a first reverse coupler portion that taps the reflected signals from the antenna, and a second reverse coupler portion that taps the reflected signals after these signals have passed through the first reverse coupler portion.

The impedance measurement circuitry may have analog processing circuitry and digital processing circuitry. The analog signal processing circuitry and digital signal processing circuitry may be used to produce an impedance measurement from the tapped signals from the coupler circuitry. The analog processing circuitry may include analog signal mixers, low pass filters, and analog-to-digital converter circuitry. The digital signal processing circuitry may process digital signals that have been received from the analog-to-digital converter circuitry in the analog processing circuitry.

BRIEF DESCRIPTION OF THE DRAWINGS

FIG. 4 shows illustrative signals that may be measured and processed using circuitry of the type shown in FIG. 3 to produce impedance measurements in accordance with an embodiment.

DETAILED DESCRIPTION

Figure 1:
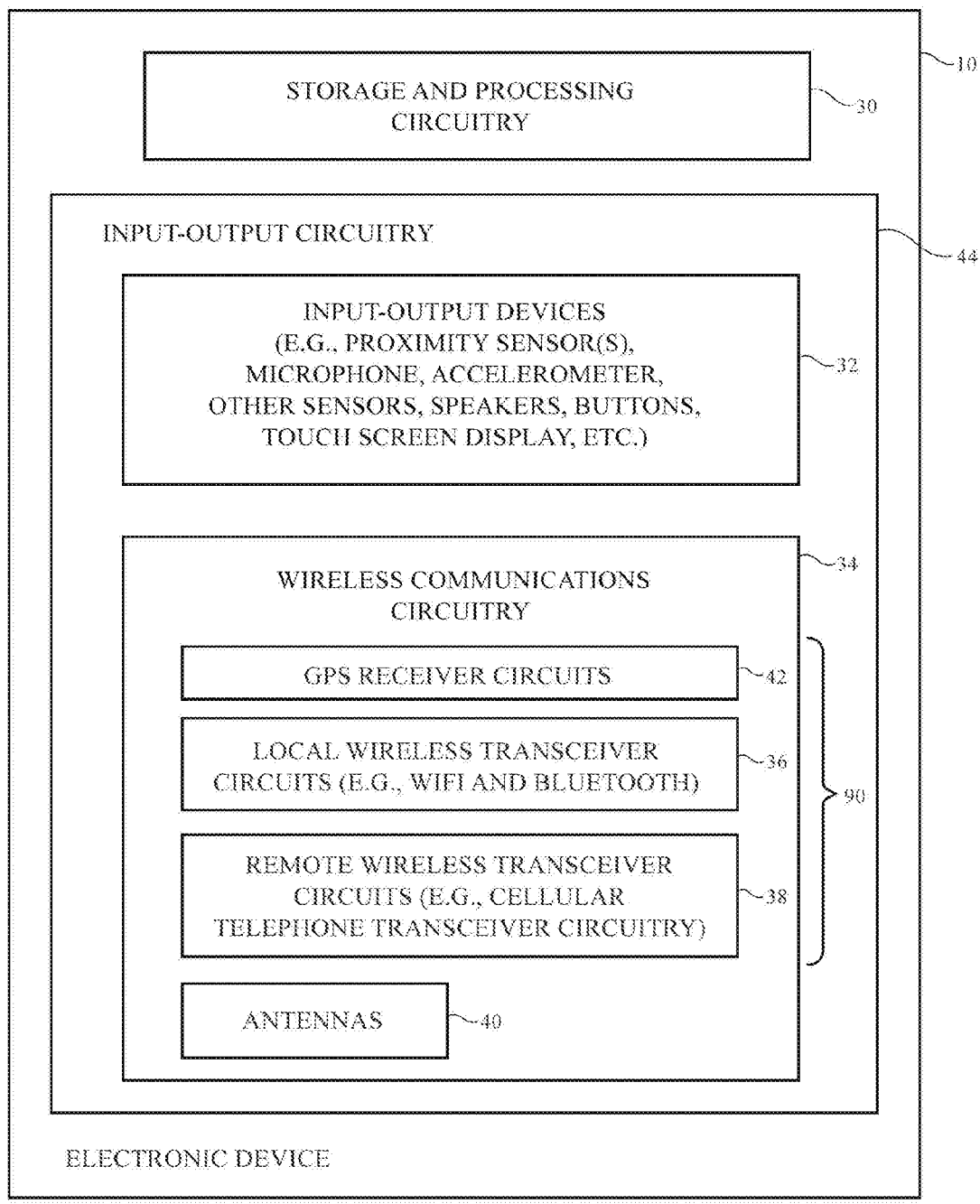
FIG. 1 is a schematic diagram of an illustrative electronic device with wireless communications circuitry in accordance with an embodiment.

An electronic device such as electronic device 10 of FIG. 1 may contain wireless circuitry. The wireless circuitry may include transceiver circuitry that is coupled to antenna structures for transmitting and receiving wireless signals. Impedance monitoring circuits may be formed within the wireless circuitry. The impedance monitoring circuits may be used to measure wireless circuit impedances. For example, antenna impedances and other impedance values may be measured. Impedance information may be used in tuning antenna structures in electronic device 10 or performing other actions.

Device 10 of FIG. 1 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Device 10 may have a display mounted in a housing formed of plastic, glass, ceramics, fiber composites, metal (e.g., stainless steel, aluminum, etc.), other suitable materials, or a combination of any two or more of these materials. The housing may be formed using a unibody configuration in which some or all of the housing is machined or molded as a single structure or may be formed using multiple structures (e.g., an internal frame structure, one or more structures that form exterior housing surfaces, etc.). The display may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. The display may be a liquid crystal display, an organic light-emitting diode display, or may be a display formed using other display technologies.

As shown in FIG. 1, device 10 may include control circuitry such as storage and processing circuitry 30. Storage and processing circuitry 30 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 30 may be used to control the operation of device 10. This processing circuitry may be based on one or more microprocessors, microcontrollers, digital signal processors, baseband processor integrated circuits, application specific integrated circuits, etc.

Storage and processing circuitry 30 may be used to run software on device 10, such as internet browsing applications, voice-over-internet-protocol (VOIP) telephone call applications, email applications, media playback applications, operating system functions, etc. To support interactions with external equipment, storage and processing circuitry 30 may be used in implementing communications protocols. Communications protocols that may be implemented using storage and processing circuitry 30 include internet protocols, wireless local area network protocols (e.g., IEEE 802.11 protocols—sometimes referred to as WiFi®), protocols for other short-range wireless communications links such as the Bluetooth® protocol, cellular telephone protocols, MIMO protocols, antenna diversity protocols, satellite navigation system protocols, etc.

Device 10 may include input-output circuitry 44. Input-output circuitry 44 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, accelerometers or other components that can detect motion and device orientation relative to the Earth, capacitance sensors, proximity sensors (e.g., a capacitive proximity sensor and/or an infrared proximity sensor), magnetic sensors, a connector port sensor or other sensor that determines whether device 10 is mounted in a dock, and other sensors and input-output components.

Input-output circuitry 44 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas 40, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42.

Transceiver circuitry 36 may be wireless local area network transceiver circuitry that may handle 2.4 GHz and 5 GHz bands for WiFi® (IEEE 802.11) communications and that may handle the 2.4 GHz Bluetooth® communications band.

Circuitry 34 may use cellular telephone transceiver circuitry 38 for handling wireless communications in frequency ranges such as a low communications band from 700 to 960 MHz, a midband from 1710 to 2170 MHz, and a high band from 2300 to 2700 MHz or other communications bands between 700 MHz and 2700 MHz or other suitable frequencies (as examples). Circuitry 38 may handle voice data and non-voice data.

Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, near field communications (NFC) circuitry, etc.

Wireless communications circuitry 34 may include satellite navigation system circuitry such as global positioning system (GPS) receiver circuitry 42 for receiving GPS signals at 1575 MHz or for handling other satellite positioning data (e.g., GLONASS signals at 1609 MHz). Satellite navigation system signals for receiver 42 are received from a constellation of satellites orbiting the earth. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Antennas 40 in wireless communications circuitry 34 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, hybrids of these designs, etc. If desired, one or more of antennas 40 may be cavity-backed antennas. Different types of antennas may be used for different bands and combinations of bands. For example, one type of antenna may be used in forming a local wireless link antenna and another type of antenna may be used in forming a remote wireless link antenna. Dedicated antennas may be used for receiving satellite navigation system signals or, if desired, antennas 40 can be configured to receive both satellite navigation system signals and signals for other communications bands (e.g., wireless local area network signals and/or cellular telephone signals).

Transmission line paths may be used to couple antenna structures 40 to transceiver circuitry 90. Transmission lines in device 10 may include coaxial cable paths, microstrip transmission lines, stripline transmission lines, edge-coupled microstrip transmission lines, edge-coupled stripline transmission lines, transmission lines formed from combinations of transmission lines of these types, etc. Filter circuitry, switching circuitry, impedance matching circuitry, and other circuitry may be interposed within the transmission lines, if desired.

Device 10 may contain multiple antennas 40. The antennas may be used together or one of the antennas may be switched into use while the other antenna(s) may be switched out of use. If desired, control circuitry 30 may be used to make wireless circuit adjustments in real time. These adjustments may include, for example, selection of an optimum antenna to use in device 10, antenna tuning settings, impedance matching circuit settings, filter settings, wireless transceiver settings, phased antenna array settings, etc. Control circuitry 30 may make a wireless circuit adjustment based on information on received signal strength, based on sensor data (e.g., orientation information from an accelerometer), based on other sensor information (e.g., information indicating whether device 10 has been mounted in a dock in a portrait orientation), based on impedance information (e.g., an antenna impedance measurement or other impedance measurement) or based on other information about the operation of device 10.

Figure 2:
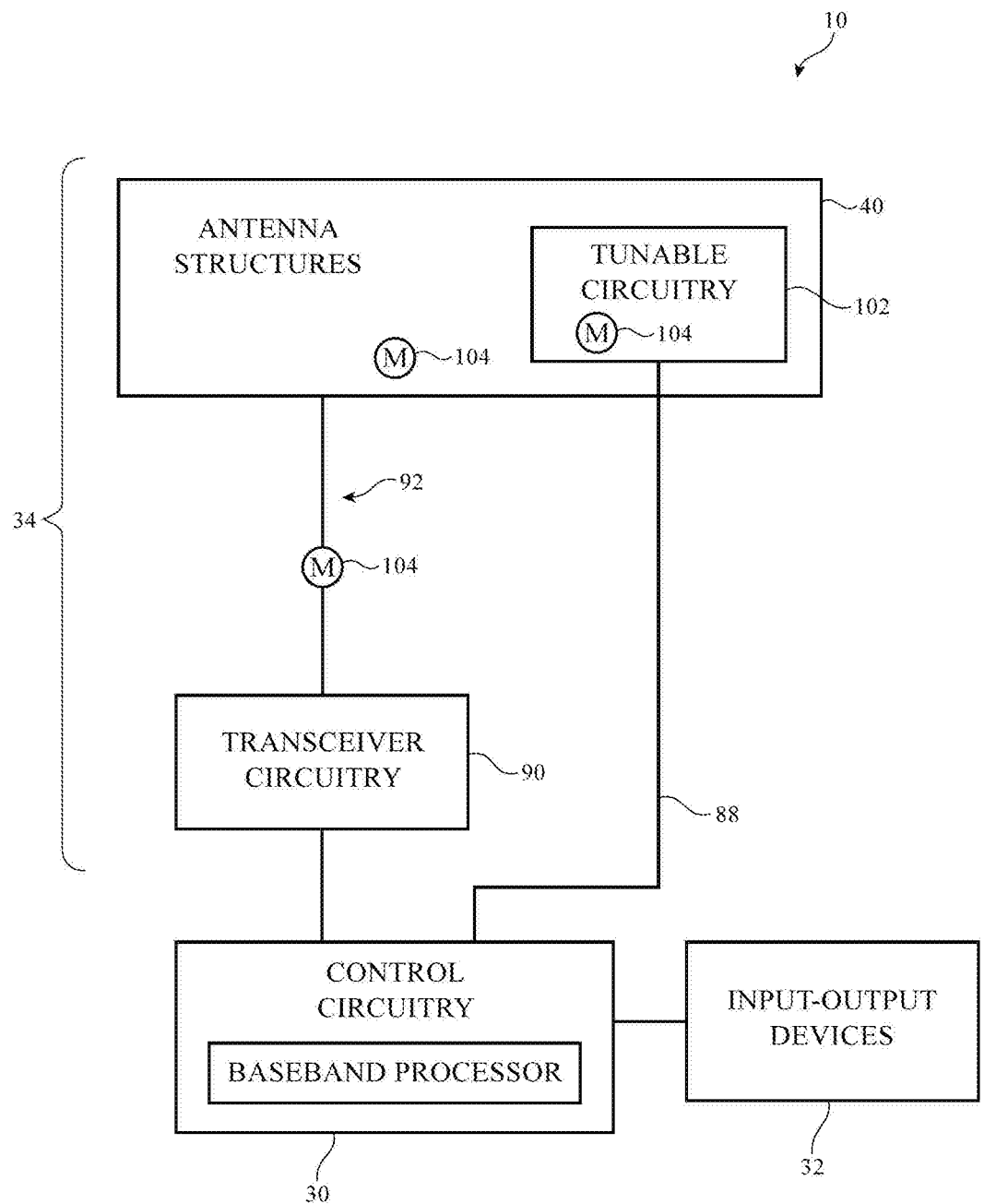
FIG. 2 is a diagram of illustrative wireless circuitry in accordance with an embodiment.

As shown in FIG. 2, transceiver circuitry 90 in wireless circuitry 34 may be coupled to antenna structures 40 using paths such as path 92. Wireless circuitry 34 may be coupled to control circuitry 30. Control circuitry 30 may be coupled to input-output devices 32. Input-output devices 32 may supply output from device 10 and may receive input from sources that are external to device 10.

Antenna structures 40 may be provided with tunable circuitry to provide antenna structures 40 with the ability to cover communications frequencies of interest and/or the ability to be adjusted to ensure satisfactory operation when loaded due to the presence of external objects. If desired, antenna structures 40 may include filter circuitry (e.g., one or more passive filters and/or one or more tunable filter circuits) or filter circuitry may be coupled to antenna structures 40. Discrete components such as capacitors, inductors, and resistors may be incorporated into the filter circuitry. Capacitive structures, inductive structures, and resistive structures may also be formed from patterned metal structures (e.g., part of an antenna).

As shown in FIG. 2, antenna structures 40 may be provided with adjustable circuits such as tunable components 102 to tune antennas 40 over communications bands of interest or to otherwise adjust antenna structures 40. Tunable components 102 may include tunable inductors, tunable capacitors, or other tunable components. Tunable components such as these may be based on switches and networks of fixed components, distributed metal structures that produce associated distributed capacitances and inductances, variable solid state devices for producing variable capacitance and inductance values, tunable filters, or other suitable tunable structures. If desired, an integrated circuit may be used to implement switching circuitry and associated control and communications circuits. The switching circuitry may be used with on-chip or external inductors or capacitors to form an adjustable inductor or an adjustable capacitor (i.e., the integrated circuit may be coupled to discrete components to form tunable component 102). During operation of device 10, control circuitry 30 may issue control signals on one or more paths such as path 88 that adjust inductance values, capacitance values, or other parameters associated with tunable components 102, thereby tuning antenna structures 40 to cover desired communications bands. Configurations in which antennas 40 are fixed (not tunable) may also be used.

Path 92 may form a transmission line. A matching network formed from components such as inductors, resistors, and capacitors may be used in matching the impedance of antenna structures 40 to the impedance of the transceiver at transmission line 90. Matching network components may be provided as discrete components (e.g., surface mount technology components) or may be formed from housing structures, printed circuit board structures, traces on plastic supports, etc. Components such as these may also be used in forming filter circuitry in antenna structures 40.

It may be desirable to monitor the performance of wireless circuitry 34 in real time. For example, it may be desirable to make impedance measurements in wireless circuitry 34 using one or more impedance monitoring circuits 104. Portions of wireless circuitry 34 such as antenna structures 40 may become loaded due to the presence of external objects in the vicinity of antenna structures 40. Tunable circuitry 102 can be adjusted in real time to compensate for loading effects and/or other adjustments may be made to wireless circuitry 34 based on impedance measurements made using impedance monitoring circuits 104.

Circuits 104 may be implemented as part of an integrated circuit that is used in forming some or all of tunable circuitry 102, may be incorporated into antenna structures 40 (e.g., by incorporating circuit 104 into a return path or part of an antenna resonating element), may be interposed in path 92, may be included within impedance matching circuitry or filter circuitry in path 92, or may be formed at other suitable locations within wireless circuitry 34. When mounted adjacent to an antenna feed for antenna 40 (e.g., when incorporated into path 92), circuitry 104 may be used to measure the impedance of antenna 40. When mounted within antenna 40 or circuitry 102, circuitry 104 may be used to measure the impedance of part of antenna 40 and/or other impedance values in wireless circuitry 34.

Figure 3:
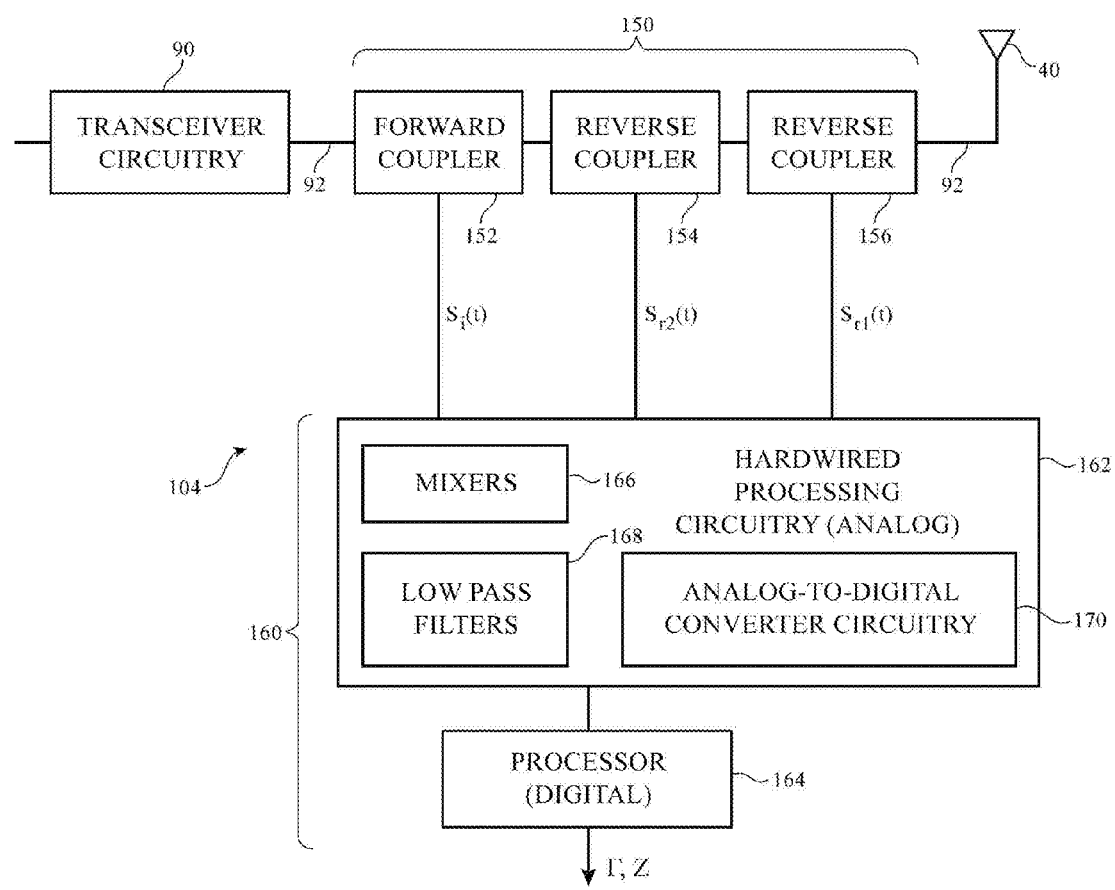
FIG. 3 is a diagram of an illustrative impedance monitoring circuit in accordance with an embodiment.

An illustrative impedance monitoring circuit that has been interposed within path 92 is shown in FIG. 3. As shown in FIG. 3, impedance monitoring circuit 104 may include signal taps such as forward coupler 152, a first reverse coupler such as reverse coupler 156, and a second reverse coupler such as reverse coupler 154. Couplers (taps) 152, 154, and 156 may be coupled in series between transceiver circuitry 90 and antenna 40. Couplers 152, 154, and 156 may be implemented as a single five port coupler, may be implemented as three separate three-port couplers, may be implemented using two couplers (e.g., a three port coupler and a four port coupler), or may be implemented using other suitable coupler circuit configurations.

During operation, transceiver 90 may transmit signals that are conveyed over path 92 to antenna 40 (e.g., normal signals during normal operation and/or test signals during optional dedicated impedance measurement operations). Forward coupler 152 may tap a portion of the transmitted signal. The tapped signal portion is shown as signal Si(t) in FIG. 3. A portion of the transmitted signal may be reflected from antenna 40. A reflection coefficient $\Gamma$ is associated with this signal reflection. First reverse coupler 156 may tap the reflected signal to produce signal Sr1(t). Second reverse coupler 154 may tap the reflected signal that has passed through tap 156, thereby producing signal Sr2(t).

There is a known phase and magnitude relationship between the tapped signals from first reverse coupler 156 and the signals from second reverse coupler 154. Using this relationship and the measured values of Si(t), Sr2(t), and Sr1(t), the signals from taps 150 can be processed to determine antenna reflection coefficient $\Gamma$ and associated antenna impedance value Z. In configurations in which monitoring circuit 104 is located elsewhere in circuitry 34 (e.g., in tunable circuit 102), monitoring circuit 104 may measure different impedance values. The use of a monitoring circuit such as monitoring circuit 104 of FIG. 3 to measure the impedance of antenna 40 is merely illustrative.

The signals from taps 150 may be processed using hardwired analog processing circuitry and/or digital processing circuitry. For example, signals from taps 150 may be processed using processing resources in a baseband processor, using processing resources in a general purpose microprocessor, using processing resources in an application-specific integrated circuit, using processing resources in an integrated circuit that is being used to control antenna tuning operations (e.g., an integrated circuit that forms tunable component 102 in antenna 40), using processing resources in an integrated circuit that is being used to control other wireless control operations (e.g., a wireless controller integrated circuit for controlling antenna tuning, filter tuning, matching circuit tuning, etc. that is separate from the baseband processor for device 10), and/or other processing resources. Signal processing may be performed using analog processing circuitry and/or digital processing circuitry.

In the illustrative configuration of FIG. 3, the signals from taps 150 are processed using processing circuitry 160. Processing circuitry 160 may include hardwired analog signal processing circuitry 162 and digital processing circuitry 164 and may be implemented as a single integrated circuit, using two integrated circuits, using all or some of three or more integrated circuits, using one or more integrated circuits and ancillary circuitry, or using other suitable circuitry. Analog processing circuitry 162 may include one or more analog signal mixers 166 (e.g., mixer circuitry that forms analog signal multipliers), low pass filter circuitry 168, and analog-to-digital converter circuitry 170. Digital output data from circuitry 170 may be provided to processor 164 over path 172.

Taps 150 may be used to gather signals Si(t), Sr1(t), and Sr2(t). Expressions for these radio-frequency signals and definitions for the terms used in these expressions are shown in FIG. 4. As shown in FIG. 4, there is a known relationship in magnitude (ρ) and phase (ϕ) between the first reflected signal Sr1 at tap 156 and the second reflected signal Sr2 at tap 154. This relationship may be determined by characterizing taps 156 and 154 during calibration operations, by fabricating taps 156 and 154 with a known relationship as part of a common coupler device, by interposing a transmission line segment and/or known circuit between taps 156 and 154, etc. Based on the known magnitude and phase relationship between Sr2 and Sr1, the equations of FIG. 4 may be solved for unknown antenna reflection coefficient F (and therefore associated antenna impedance Z) for antenna under test (AUT) 40. In configurations in which circuit 104 is placed within a tuning circuit, matching circuit, filter, transmission line, or a part of antenna 40, the measured reflection coefficient and impedance will not necessarily correspond to the reflection coefficient and impedance for antenna 40, but nonetheless may provide information on the current operation conditions for wireless circuitry 34 that can be exploited during operation of device 10.

Figure 5:
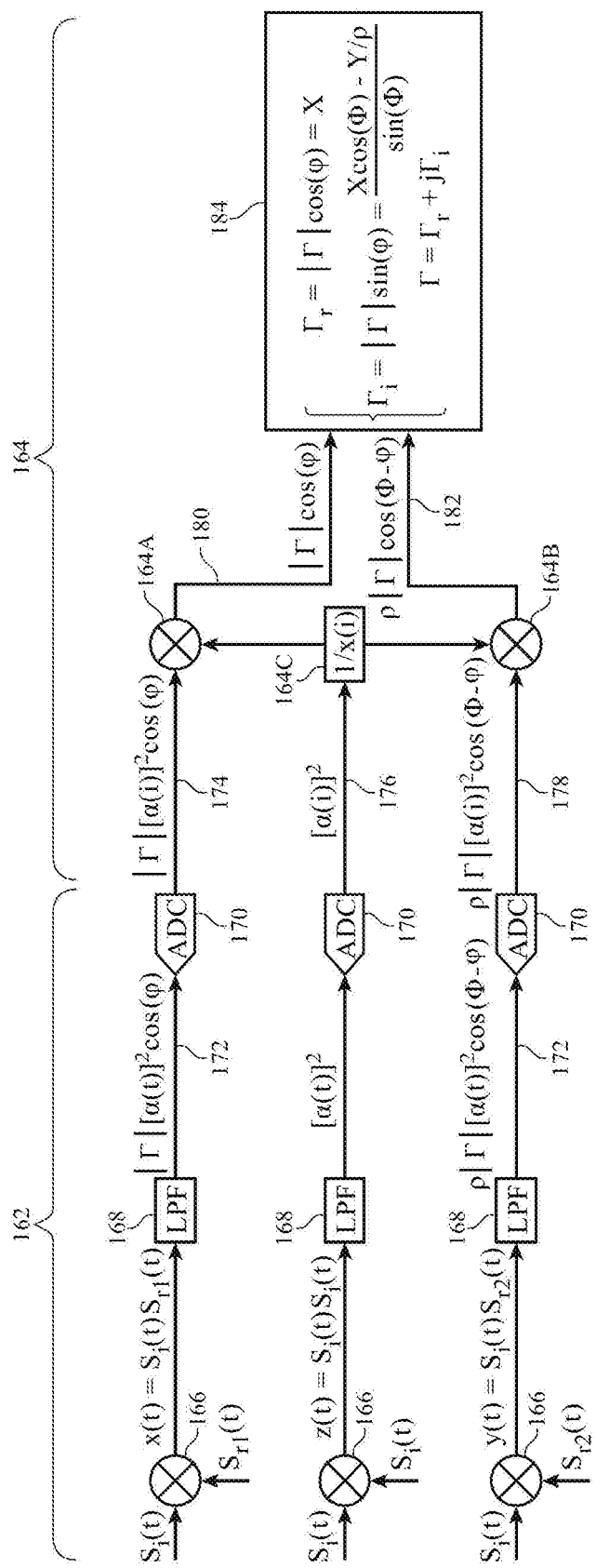
FIG. 5 is a diagram showing how signals of the type shown in FIG. 4 may be processed using circuitry of the type shown in FIG. 3 to produce impedance measurements in accordance with an embodiment.

A signal processing arrangement of the type shown in FIG. 5 may be used in determining the value of reflection coefficient F and impedance Z. Analog signal processing operations (e.g., analog signal mixing, filtering, and analog-to-digital conversion) may be performed using analog signal processing circuitry 162. Digital signal processing operations may be performed using digital processing circuitry 164.

As shown in FIG. 5, analog mixers 166 may receive signals Si, Sr1, and Sr2 from taps 150. Mixers 166 may mix the signals received at their input ports and may produce corresponding mixed signals on their output ports. For example, a first mixer 166 may mix signals Si(t) and Sr1(t) to produce mixed signal x(t), a second mixer 166 may mix signals Si(t) and Si(t) to produce mixed signal z(t), and a third mixer 166 may mix signals Si(t) and Sr2(t) to produce mixed signal y(t). Low pass filters 168 may be used to block unwanted higher frequency mixing products from signals x(t), y(t), and z(t), leaving the signals shown on paths 172.

The signals on paths 172 are digitized using analog-to-digital converters 170 to produce corresponding digital signals on respective paths 174, 176, and 178 in digital processing circuitry 164. The signal 2 on path 176 may be inverted by digital signal inverter 164C. The inverted output of inverter 164C may be multiplied by the signal on path 174 using mixer 164A, thereby producing the signal on path 180 (i.e., the signal on path 174 may be divided by the signal on path 176). The inverted output of inverter 164C may also be multiplied by the signal on path 178 using mixer 164B, thereby producing the signal on path 182 (i.e., the signal on path 178 may be divided by the signal on path 176). The signals on paths 180 and 182 may be used to solve for the complex reflection coefficient Γ (and therefore the complex impedance Z), as shown in box 184. In box 184, Γr represents the real portion of Γ and Γi represents the imaginary part of Γ.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
  wireless circuitry that includes an antenna and a radio-frequency transceiver that transmits signals to the antenna, wherein some of the transmitted signals reflect from the antenna as reflected signals; and
  an impedance measurement circuit having:
    a forward coupler that taps the transmitted signals;
    a first reverse coupler that taps the reflected signals; and
    a second reverse coupler that taps the reflected signals after the reflected signals have passed through the first reverse coupler.

2. The electronic device defined in claim 1 wherein the impedance measurement circuit further comprises analog processing circuitry.

3. The electronic device defined in claim 2 wherein the analog processing circuitry includes analog mixing circuitry that receives the transmitted signals tapped by the forward coupler, the reflected signals tapped by the first reverse coupler, and the reflected signals tapped by the second reverse coupler.

4. The electronic device defined in claim 3 wherein the analog processing circuitry further comprises low pass filter circuitry that filters signals from the analog mixing circuitry to produce filtered signals.

5. The electronic device defined in claim 4 wherein the analog processing circuitry further comprises analog-to-digital converter circuitry that digitizes the filtered signals.

6. The electronic device defined in claim 5 wherein the impedance measurement circuitry further comprises digital processing circuitry.

7. The electronic device defined in claim 6 wherein the digital processing circuitry processes the digitized filtered signals to produce an antenna impedance measurement.

8. The electronic device defined in claim 1 wherein the forward coupler and the first and second reverse couplers are coupled in series between the radio-frequency transceiver and the antenna.

9. The electronic device defined in claim 8 wherein the antenna comprises a tunable antenna having a tunable circuit.

10. The electronic device defined in claim 9 wherein the impedance measurement circuit further comprises analog processing circuitry that includes analog mixing circuitry that receives the transmitted signals tapped by the forward coupler, the reflected signals tapped by the first reverse coupler, and the reflected signals tapped by the second reverse coupler.

11. Wireless circuitry, comprising:
  an antenna;
  a radio-frequency transceiver coupled to the antenna;
  a path that carries radio-frequency signals as the radio-frequency transceiver transmits signals with the antenna; and an impedance measurement circuit having first, second, and third couplers that tap signals flowing on the path, wherein the impedance measurement circuit comprises analog signal processing circuitry and digital signal processing circuitry that process signals from the first, second, and third couplers of the impedance measurement circuit to produce an impedance measurement.

12. The wireless circuitry defined in claim 11 wherein the first coupler is a forward coupler that taps signals flowing in a forward direction on the path.

13. The wireless circuitry defined in claim 12 wherein the second and third couplers comprise reverse couplers that tap into signals flowing in a reverse direction on the path that is opposite to the forward direction.

14. The wireless circuitry defined in claim 13 wherein the second and third couplers are coupled in series in the path.

15. The wireless circuitry defined in claim 14 wherein the third coupler receives signals that have passed through the second coupler.

16. The wireless circuitry defined in claim 15 wherein the analog signal processing circuitry includes:
    a first analog signal mixer that receives signals from the first coupler and the second coupler;
    a second analog signal mixer that receives signals from the first coupler; and
    a third analog signal mixer that receives signals from the first coupler and the third coupler.

17. The wireless circuitry defined in claim 16 further comprising low pass filter circuitry that filters signals from the first, second, and third analog signal mixers.

18. The wireless circuitry defined in claim 17 further comprising analog-to-digital converter circuitry that digitizes signals from the low pass filter circuitry, wherein the digital signal processing circuitry produces the impedance measurement using the digitized signals.

19. The wireless circuitry defined in claim 18 wherein the analog signal processing circuitry and the digital signal processing circuitry are formed from an integrated circuit.

20. An impedance measurement circuit coupled in a signal path that carries radio-frequency signals within wireless circuitry in an electronic device, comprising:
    a forward coupler that taps into transmitted signals flowing on the signal path, wherein the transmitted signals are reflected to form reflected signals;
    a first reverse coupler that taps into the reflected signals;
    a second reverse coupler that taps into the reflected signals after the reflected signals have passed through the first reverse coupler; and
    analog signal processing circuitry including mixer circuitry that receives the tapped transmitted signals, the tapped reflected signals from the first reverse coupler, and the tapped reflected signals from the second reverse coupler.

21. The impedance measurement circuit defined in claim 20 further comprising:
    digital signal processing circuitry that processes signals from the analog signal processing circuitry to produce an impedance measurement.

* * * * *